United States Patent
Fujioka et al.

(10) Patent No.: US 6,472,296 B2
(45) Date of Patent: Oct. 29, 2002

(54) FABRICATION OF PHOTOVOLTAIC CELL BY PLASMA PROCESS

(75) Inventors: Yasushi Fujioka, Kyoto; Shotaro Okabe, Nara; Masahiro Kanai, Kyoto; Akira Sakai, Kyoto; Tadashi Sawayama, Kyoto; Yuzo Koda, Kyotanabe; Takahiro Yajima, Kyoto, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/912,343

(22) Filed: Jul. 26, 2001

(65) Prior Publication Data

US 2002/0001924 A1 Jan. 3, 2002

Related U.S. Application Data

(62) Division of application No. 09/363,825, filed on Jul. 30, 1999, now Pat. No. 6,287,943.

(30) Foreign Application Priority Data

Jul. 31, 1998 (JP) .......................................... 10-216733
Jul. 31, 1998 (JP) .......................................... 10-216734

(51) Int. Cl.$^7$ .......................... H01L 21/20; H01L 21/36
(52) U.S. Cl. ......................... 438/485; 438/57; 136/245; 136/258
(58) Field of Search ................................ 136/245, 258; 427/569, 574, 588; 438/57, 62, 96, 482, 484, 485

(56) References Cited

U.S. PATENT DOCUMENTS

| | | | |
|---|---|---|---|
| 4,400,409 A | 8/1983 | Izu et al. | 427/39 |
| 4,406,765 A | 9/1983 | Higashi et al | 204/164 |
| 5,204,272 A | 4/1993 | Guha et al. | 438/96 |

*Primary Examiner*—Michael Sherry
*Assistant Examiner*—Asok Kumar Sarkar
(74) *Attorney, Agent, or Firm*—Fitzpatrick, Cella, Harper & Scinto

(57) ABSTRACT

A process for producing a semiconductor layer by introducing a raw gas into a discharge chamber and supplying high-frequency power to the chamber to decompose the raw gas by discharge, thereby forming a semiconductor layer on a substrate within the discharge chamber, the process comprising the steps of supplying high-frequency power of at least very high frequency (VHF) as the high-frequency power; supplying bias power of direct current power and/or high-frequency power of radio-frequency (RF) together with the high-frequency power of VHF to the discharge chamber; and controlling a direct current component of an electric current flowing into an electrode, to which the bias power is supplied, so as to fall within a range of from 0.1 A/m$^2$ to 10 A/m$^2$ in terms of a current density based on the area of an inner wall of the discharge chamber. A good-quality semiconductor layer can be deposited over a large area at a high speed.

26 Claims, 6 Drawing Sheets

FABRICATION OF PHOTOVOLTAIC CELL BY PLASMA PROCESS

This application is a division of application Ser. No. 09/363,825, filed Jul. 30, 1999, now U.S. Pat. No. 6,287,943.

BACKGROUND OF THE INVENTION

1. Field of the Invention

The present invention relates to a process for producing a semiconductor layer on a substrate and an apparatus for producing the semiconductor layer, and particularly to process and apparatus for producing a semiconductor layer of a non-monocrystalline silicon type such as amorphous silicon, amorphous silicon germanium, amorphous silicon carbide or microcrystalline silicon, which is used in solar cells, photosensitive drums for copying machines, image sensors for facsimiles, thin film transistors for liquid crystal display devices, etc. The present invention also relates to a process for fabricating a photovoltaic cell using such a production process.

2. Related Background Art

Amorphous silicon permits the formation of a large-area semiconductor film by a plasma CVD process and so permits the fabrication of a large-area semiconductor device with comparative ease compared with crystalline silicon and polycrystalline silicon.

Therefore, amorphous silicon films are often used in semiconductor devices of which a large area is required, specifically, in solar cells, photosensitive drums for copying machines, image sensors for facsimiles, thin film transistors for liquid crystal display devices, etc.

These devices are larger in the area of a device compared with devices comprising crystalline semiconductors, such as LSI and CCD. In the case of, for example, a solar cell, an area as large as about 30 $m^2$ per home is required to provide an output of about 3 kW, by which electric power for general home is furnished, when a conversion efficiency thereof is 10%. Therefore, a solar cell module also occupies a considerable large area.

The formation of an amorphous silicon film is generally conducted by a plasma CVD process in which a Si-containing raw gas such as $SiH_4$ or $Si_2H_6$ is decomposed by high-frequency discharge into a plasma state, and a film is formed on a substrate placed in the plasma.

In the case where the amorphous silicon film is formed by the plasma CVD process, high frequency of RF (radio frequency; about 13.56 MHz) has heretofore been generally used.

On the other hand, attention has been paid to plasma CVD using VHF (very high frequency) in recent years.

For example, Amorphous Silicon Technology, pp. 15–26, 1992 (Materials Research Society Symposium Proceedings Volume 258) reports that discharge frequency is changed from RF of 13.56 MHz to VHF, whereby high-density plasma can be obtained to enhance a film-forming rate to a markedly high degree, so that a good deposited film can be formed at a high speed.

U.S. Pat. No. 4,406,765 discloses a high-frequency plasma CVD process in which a direct current (DC) electric field is applied. It is said that a moderate DC electric field is applied together with a high-frequency electric field in the plasma CVD process, whereby a good-quality amorphous semiconductor can be provided.

However, the application of the plasma CVD process using VHF, which is capable of forming a deposited film at a high speed as described above, to deposition of a large-area film has involved the following problems.

Namely, when a large-area flat plate discharge electrode generally used in RF is used to induce uniform discharge over a large area, impedance is hard to be matched in VHF, resulting in difficulty of obtaining uniform plasma on the discharge electrode.

When a rod or radial antenna electrode is used, impedance is matched. However, the balance of an area ratio between the discharge electrode and an opposite electrode, which is substantially 1 in parallel-plate electrodes, is destroyed due to the extremely small area of the discharge electrode. The absolute value of self-bias, which should become smaller in small-area parallel-plate electrodes as frequency increases, becomes greater on the contrary, so that the discharge electrode generates high negative self-bias voltage. In this case, the area of the discharge electrode is small, and so a large-area substrate cannot be place thereon, and high positive voltage against the discharge electrode is applied to the substrate.

As disclosed in U.S. Pat. No. 4,406,765 described above, it is important to apply the moderate DC electric field together with the high-frequency electric field in order to provide a good-quality amorphous semiconductor. It has however been difficult to control the quantity of bias supply power for suitably controlling the DC electric field without causing abnormal discharge such as spark in a discharge chamber or causing dielectric breakdown by charge-up on the surface of the resulting deposited film.

In order to control the DC electric field, it has been known to apply high-frequency bias power in addition to the high-frequency power for decomposing a raw gas by discharge, besides the above-described method by the application of the DC voltage. This method is disclosed in Japanese Patent Application Laid-Open No. 6-232429 and the like. Even in this case, it has been difficult to control the quantity of bias supply power for suitably controlling the DC electric field without causing abnormal discharge such as spark in a discharge chamber or causing dielectric breakdown by charge-up on the surface of the resulting deposited film.

In addition, as a continuous fabrication apparatus of an amorphous silicon type semiconductor device, U.S. Pat. No. 4,400,409 and the like disclose a continuous plasma CVD apparatus using a roll to roll system.

According to this apparatus, plural glow discharge chambers are provided, and a large-area device having semiconductor junctions can be continuously fabricated by arranging the glow discharge chambers along a passageway through which a sufficiently long band-like substrate having a desired width successively passes and feeding the substrate in the longitudinal direction thereof while depositing and forming a semiconductor film of a necessary conductive type in each glow discharge chamber.

As described above, when the continuous plasma CVD apparatus of the roll to roll system is used, the device can be continuously fabricated for a long period of time without stopping the fabrication apparatus, so that high productivity can be achieved.

When DC electric field is applied to plasma in this plasma CVD process of the roll to roll system, however, the same problems as described above have been encountered in VHF in particular.

The roll to roll system has also involved a problem that although there is a plurality of discharge chambers in which a deposited film is formed, DC voltage of different levels cannot be applied to the plural discharge chambers by such a method by applying DC voltage to the substrate side as disclosed in U.S. Pat. No. 4,406,765, since the substrate is continuous and common and is generally conductive, so that a bias voltage level cannot be suitably set according to the kind of a deposited film and discharge conditions in each discharge chamber.

SUMMARY OF THE INVENTION

It is an object of the present invention to provide a process and an apparatus which can solve the problem involved in the case where in the abovedescribed process for forming a semiconductor layer, the VHF plasma CVD process capable of achieving a high film-forming rate is applied to the deposition of a large-area film, that is to say, the problem that although it is necessary to apply a moderate DC electric field together with a high-frequency electric field, it is difficult to control the quantity of bias supply power for achieving a good bias effect while preventing the occurrence of a failure by spark or charge-up in the resulting deposited film, so as to easily set a proper quantity of bias supply power, thereby depositing a good-quality semiconductor layer over a large area at a high speed.

Another object of the present invention is to provide a process and an apparatus for producing a semiconductor layer by continuously forming a deposited film over a large area, by which the VHF plasma CVD process capable of obtaining high-density plasma is introduced for forming a plurality of layers, and DC electric fields are controlled to respective proper levels, whereby a laminated good-quality semiconductor film can be produced.

The above objects can be achieved by the present invention described below.

According to the present invention, there is thus provided a process for producing a semiconductor layer by introducing a raw gas into a discharge chamber and supplying high-frequency power to the chamber to decompose the raw gas by discharge, thereby forming a semiconductor layer on a substrate within the discharge chamber, the process comprising the steps of:

supplying high-frequency power of at least very high frequency (VHF) as the high-frequency power;

supplying bias power of direct current power and/or high-frequency power of radio-frequency (RF) together with the high-frequency power of VHF to the discharge chamber; and controlling a direct current component of an electric current flowing into an electrode, to which the bias power is supplied, so as to fall within a range of from 0.1 A/m$^2$ to 10 A/m$^2$ in terms of a current density based on the area of an inner wall of the discharge chamber.

According to the present invention, there is also provided a process for producing a semiconductor layer by introducing a raw gas into a plurality of discharge chambers, supplying high-frequency power to the chambers to decompose the raw gas by discharge, and causing a substrate to successively pass through the discharge chambers, thereby forming a plurality of semiconductor layers on the substrate, the process comprising the steps of:

supplying high-frequency power of very high frequency (VHF) as the high-frequency power to two or more discharge chambers of the plural discharge chambers;

supplying bias power of different levels from each other to the discharge chambers, to which the high-frequency power of VHF is supplied, according to respective film-forming conditions in the discharge chambers; and controlling the electric potential of each electrode, to which the bias power is supplied, to the same level as that of the substrate or positive potential against the substrate.

According to the present invention, there is further provided a process for fabricating a photovoltaic cell, comprising the steps of introducing a raw gas into a discharge chamber and supplying high-frequency power to the chamber to decompose the raw gas by discharge, thereby forming an i-type semiconductor layer on a substrate within the discharge chamber, the process comprising the steps of:

supplying high-frequency power of at least very high frequency (VHF) as the high-frequency power in the step of forming the i-type semiconductor layer;

supplying bias power of direct current power and/or high-frequency power of radio-frequency (RF) together with the high-frequency power of VHF to the discharge chamber; and controlling a direct current component of an electric current flowing into an electrode, to which the bias power is supplied, so as to fall within a range of from 0.1 A/m$^2$ to 10 A/m$^2$ in terms of a current density based on the area of an inner wall of the discharge chamber.

According to the present invention, there is still further provided a process for fabricating a photovoltaic cell by introducing a raw gas into a plurality of discharge chambers, supplying high-frequency power to the chambers to decompose the raw gas by discharge, and causing a substrate to successively pass through the discharge chambers, thereby at least forming a plurality of i-type semiconductor layers on the substrate, the process comprising the steps of:

supplying high-frequency power of very high frequency (VHF) as the high-frequency power to two or more discharge chambers of the plural discharge chambers in which the respective i-type semiconductor layers are formed;

supplying bias power of different levels from each other to the discharge chambers, to which the high-frequency power of VHF is supplied, according to respective film-forming conditions in the discharge chambers; and controlling the electric potential of each electrode, to which the bias power is supplied, to the same level as that of the substrate or positive potential against the substrate.

The above-described production and fabrication processes may be used in combination.

In each process, a raw gas comprising a silicon atom-containing molecule may preferably be used as the raw gas to form a silicon type non-monocrystalline semiconductor layer on the substrate.

The substrate and the inner wall surface of the discharge chamber may preferably be controlled to earth potential.

The bias power may preferably be supplied to an electrode provided independently of the electrode to which the high-frequency power of VHF is supplied, or to the electrode to which the high-frequency power of VHF is supplied. DC power may be preferably used as the bias power.

The semiconductor layer may preferably be formed in accordance with a plasma CVD process.

A band-like and/or conductive substrate may preferably be used as the substrate.

The substrate may preferably be used as a part of the inner wall of the discharge chamber.

According to the present invention, there is yet still further provided an apparatus for producing a semiconductor layer by introducing a raw gas into a discharge chamber and supplying high-frequency power to the chamber to decompose the raw gas by discharge, thereby forming a semiconductor layer on a substrate within the discharge chamber, the apparatus comprising:

a means for supplying high-frequency power of at least very high frequency (VHF) as the high-frequency power;

a means for supplying bias power of direct current power and/or high-frequency power of radio-frequency (RF) together with the high-frequency power of VHF to the discharge chamber; and a means for controlling a direct current component of an electric current flowing into an electrode, to which the bias power is supplied, so as to fall within a range of from 0.1 $A/m^2$ to 10 $A/m^2$ in terms of a current density based on the area of an inner wall of the discharge chamber.

According to the present invention, there is yet still further provided an apparatus for producing a semiconductor layer by introducing a raw gas into a plurality of discharge chambers, supplying high-frequency power to the chambers to decompose the raw gas by discharge, and causing a substrate to successively pass through the discharge chambers, thereby forming a plurality of semiconductor layers on the substrate, the apparatus comprising:

a means for supplying high-frequency power of very high frequency (VHF) as the high-frequency power to two or more discharge chambers of the plural discharge chambers;

a means for supplying bias power of different levels from each other to the discharge chambers, to which the high-frequency power of VHF is supplied, according to respective film-forming conditions in the discharge chambers; and a means for controlling the electric potential of each electrode, to which the bias power is supplied, to the same level as that of the substrate or positive potential against the substrate.

In these apparatus, the means for supplying the high-frequency power of VHF may preferably comprise a discharge electrode and a high-frequency power source of VHF connected to the discharge electrode. The means for supplying the bias power may preferably comprise a bias electrode provided separately from the discharge electrode and a power source connected to the bias electrode, or comprise a power source connected to the discharge electrode.

In the case where the means for supplying the bias power comprises a direct current power source connected to the discharge electrode, the power source may preferably be connected through a high-frequency power blocking means. At that time, the high-frequency power source may preferably be connected to the discharge electrode through a direct current power blocking means.

DESCRIPTION OF THE PREFERRED EMBODIMENTS

In the present invention, high-frequency power of VHF is first used as high-frequency power for decomposing a raw gas in the formation of a semiconductor layer in accordance with a high-frequency plasma CVD process, whereby high-density plasma can be formed to achieve a high deposition rate.

At least one of DC power and RF power is further supplied as bias power to a film forming chamber (discharge chamber) at the same time as the supply of the VHF power to make an improvement in film quality. At that time, a direct current component of an electric current flowing into a bias electrode is measured to monitor the supplied state of the bias power to the film forming chamber and control the quantity of supply power in such a manner that the direct current component of the electric current flowing into the bias electrode falls within a range of from 0.1 $A/m^2$ to 10 $A/m^2$ in terms of a current density based on the area of an inner wall of the film forming chamber, whereby the quantity of bias supply power can be set to a proper quantity of bias supply power by which a good bias effect is achieved without causing a failure by spark or charge-up in the resulting semiconductor layer.

Figure 4A:
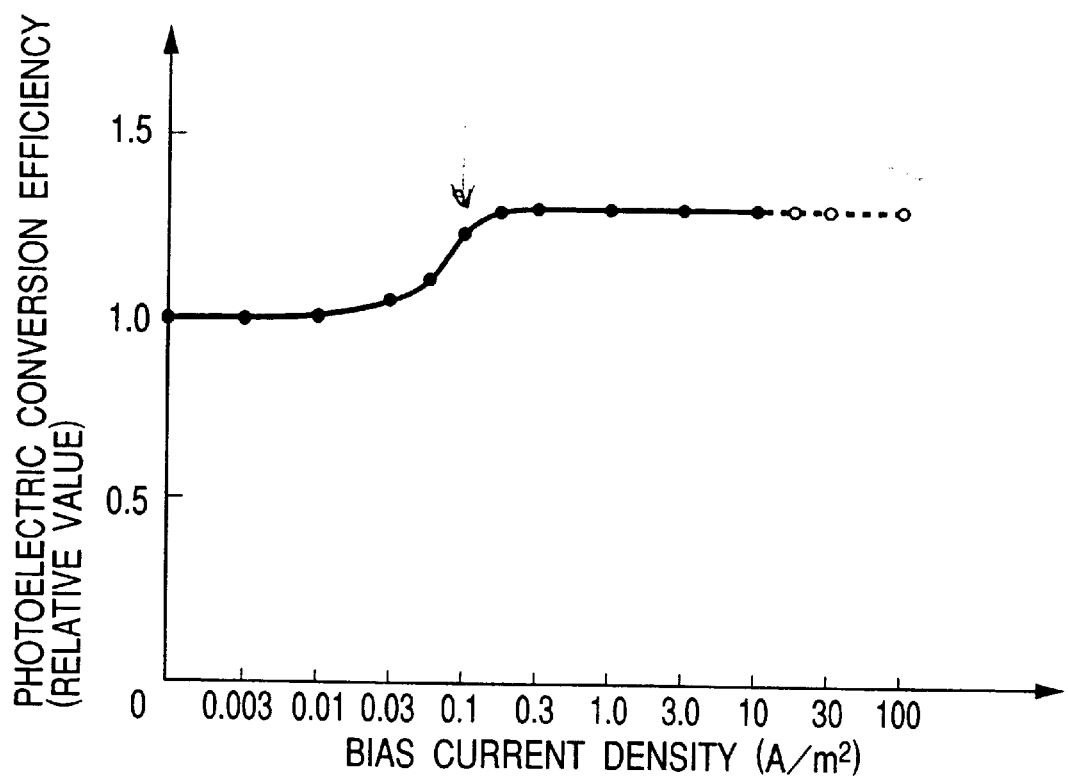
FIGS. 4A and 4B diagrammatically illustrate the relationships between DC bias current density and the characteristics of a photovoltaic cell.
Figure 4B:
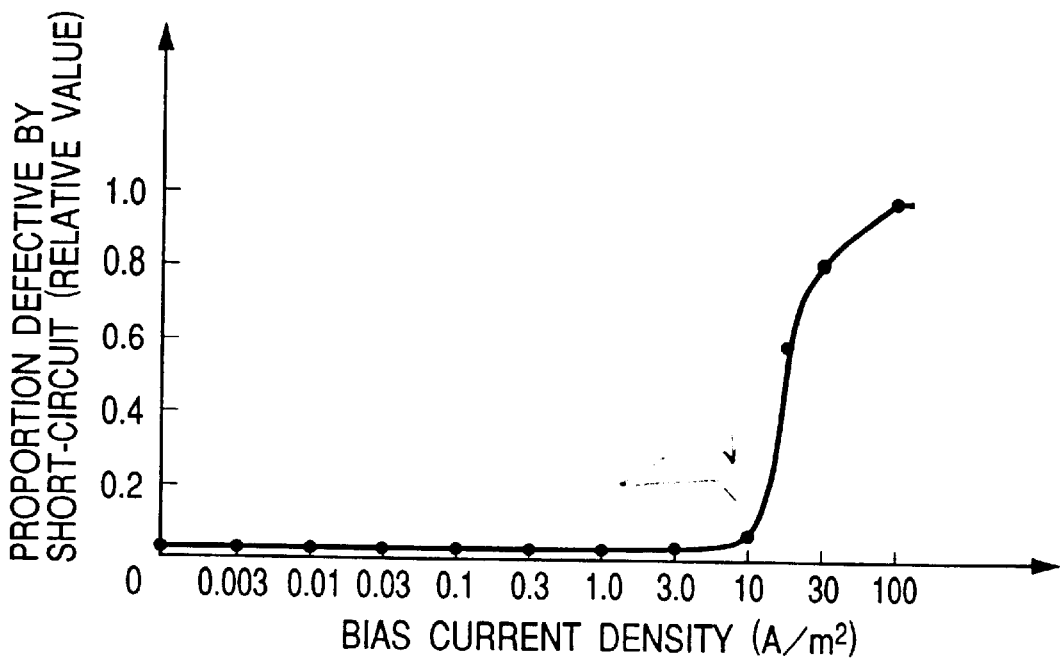

FIGS. 4A and 4B illustrate results obtained at the time the process according to the present invention was applied to the formation of an i-type layer of a solar cell having a semiconductor layer of an nip structure in accordance with the process set forth in Examples, which will be described subsequently, to fabricate a solar cell module comprising non-monocrystalline silicon on a stainless steel substrate.

FIG. 4A diagrammatically illustrates the relationship between the photoelectric conversion efficiency of the fabricated solar cell module and the bias current density of DC bias power supplied to a film forming chamber based on the area of an inner wall of a film forming chamber. As apparent from this graph, good cell characteristics are achieved under conditions that the bias current density is about 0.1 $A/m^2$ or higher.

On the other hand, FIG. 4B diagrammatically illustrates the relationship between the proportion defective by short-circuit of the i-type layer of the fabricated solar cell module and the bias current density of DC bias power supplied to the film forming chamber based on the area of the inner wall of the film forming chamber. As apparent from this graph, the short-circuit defect comes to rapidly occur under conditions that the bias current density is about 10 $A/m^2$ or higher.

At this time, the area of the inner wall of the film forming chamber was 0.8 $m^2$, VHF was 100 MHz, and the intensity of the direct current was controlled by adjusting voltage applied.

The present inventors have further carried out a similar investigation as to the correlation between the current density of an electric current flowing into the bias electrode, and the photoelectric conversion efficiency and proportion defective by short-circuit of the resultant solar cell module by changing the bias power supplied to radio-frequency (13.56 MHz) power, and the same results as described above were obtained, i.e., good cell characteristics were achieved under conditions of about 0.1 A/m² or higher, and the short-circuit defect rapidly occurred under conditions of about 10 A/m² or higher.

A similar investigation to the above was still further carried out by varying the area of the inner wall of the film forming chamber and VHF within ranges of from 0.1 m² to 3 m² and from 20 MHz to 500 MHz, respectively, and the same results as described above were obtained, i.e., good cell characteristics were achieved under conditions of about 0.1 A/m² or higher, and the short-circuit defect rapidly occurred under conditions of about 10 A/m² or higher.

As described above, when a rod or radial antenna electrode is used in place of a flat plate discharge electrode in the case where VHF is used, impedance is matched. However, the absolute value of self-bias of the discharge electrode becomes greater on the contrary, so that an unfavorable negative DC electric field is formed on the discharge electrode side.

When the VHF plasma CVD process is intended to be adopted in an apparatus of the roll to roll system or the like which can form a deposited film over a large area, it is therefore important to control the DC electric field by, for example, applying bias power such as DC power in order to eliminate the influence of the negative self-bias on the discharge electrode side to obtain a good-quality film over a large area.

As a method for applying the bias power such as DC power to the film forming chamber to which high-frequency power of VHF is supplied, there is considered a method in which a bias electrode for applying bias power is provided separately from a VHF discharge electrode within the film forming chamber, or a method in which bias power such as DC power is applied together with high-frequency power to a VHF discharge electrode to overlap each other.

The method in which the DC power is applied together with the high-frequency power to the VHF discharge electrode to overlap each other can reduce the number of electrodes to simplify the structure of the film forming chamber. However, it is necessary to block high frequency by a high-frequency power blocking means such as a choke coil in order for the high-frequency power not to enter a DC power-applying circuit, and for the high-frequency power source, to block the direct current by a DC power blocking means such as a capacitor in order for the direct current not to flow.

Here, DC power of different levels from each other is applied to a plurality of discharge chambers, of which high-density plasma is required, according to respective film-forming conditions, whereby a good-quality semiconductor layer is continuously produced on a band-like substrate, and in its turn the photoelectric conversion efficiency of the resulting solar cell module is improved.

The embodiments of the present invention will hereinafter be described in detail.

<Bias Power>

When bias power such as DC power is supplied to a film forming chamber in the present invention, it is desirable to control the electric potential of an electrode (bias electrode), to which the bias power is supplied, to the same level as that of a substrate or positive potential against the substrate. It is also preferred that the potential be set to a proper level in such a manner that a potential difference between the bias electrode and the substrate is controlled within a range of preferably from 0 to 500 V, more preferably from 50 to 400 V in order for a current level to falls within a prescribed range.

<Method of Applying DC Bias Power>

As a method of applying the DC bias power to the film forming chamber in the process of the present invention, there is a method in which a bias electrode for applying bias power is provided separately from a VHF discharge electrode within the film forming chamber, or a method in which DC power is applied together with high-frequency power to a VHF discharge electrode to overlap each other.

The method in which the DC power is applied together with the high-frequency power to the VHF discharge electrode to overlap each other can reduce the number of electrodes to simplify the structure of the film forming chamber. However, it is necessary to block high frequency by a high-frequency power blocking means such as a choke coil in order for the high-frequency power not to enter a DC power-applying circuit, and for the high-frequency power source, to block the direct current by a capacitor or the like in order for the direct current not to flow.

Figure 1:
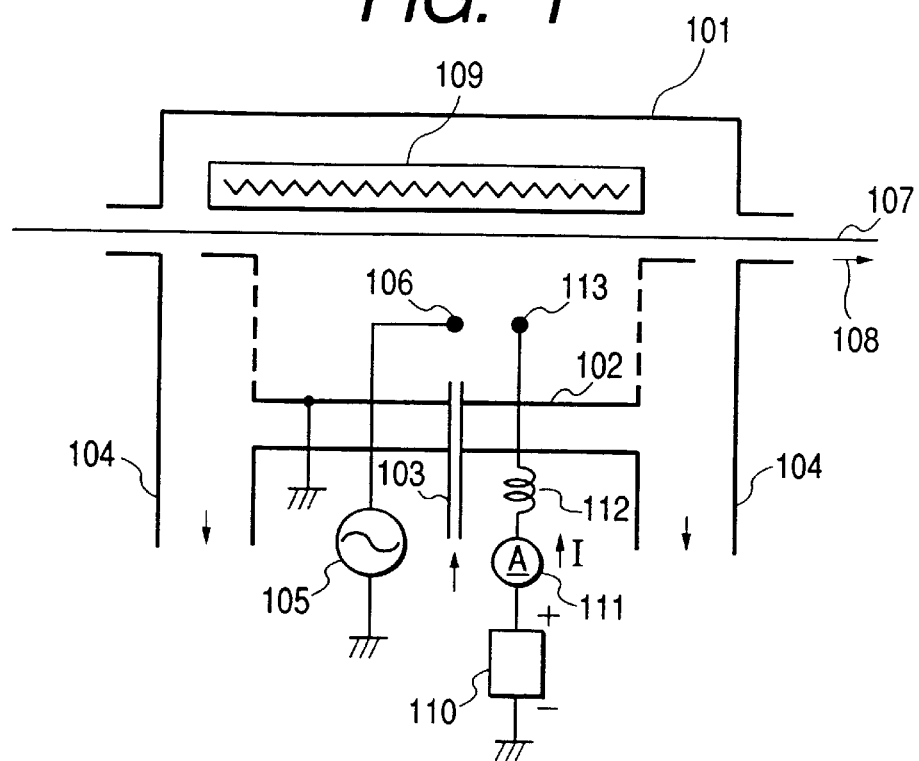
FIG. 1 is a schematic cross-sectional view illustrating an example of the production apparatus of a semiconductor layer according to the present invention.

FIG. 1 is a schematic cross-sectional view illustrating an example of an apparatus for practicing the present invention, in which a bias electrode for applying DC bias power is provided separately from a VHF discharge electrode within a film forming chamber.

In FIG. 1, film forming chamber (discharge chamber) 102 is provided within vacuum vessel 101. In film forming chamber 102, there are provided gas inlet pipe 103 for introducing a raw gas for a deposited film, exhaust pipe 104 connected to an exhauster (not illustrated), rod electrode 106 which is a means for discharging high-frequency power connected to high-frequency power source 105 of VHF, moving substrate 107, and heater 109 for heating the substrate. A deposited film is formed on the moving substrate by the plasma CVD process.

Rod electrode 106 which is the means for discharging high-frequency power is arranged along the depthwise direction in FIG. 1 in such a manner that its longitudinal direction is perpendicular to the moving direction 108 of the substrate.

Bias electrode 113 is provided within film forming chamber 102, and bias power is supplied from DC power source 110. A direct current component of an electric current flowing into bias electrode 113 is measured by ammeter 111.

Choke coil 112 is provided between bias electrode 113 and ammeter 111 to block the entry of the VHF power into the DC circuit.

Figure 2:
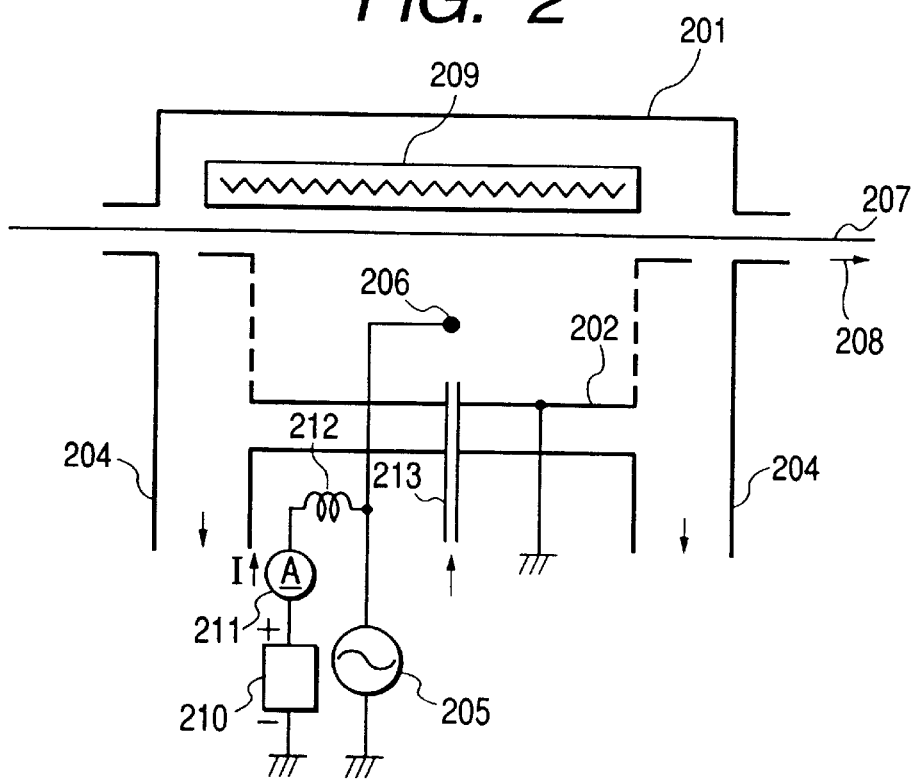
FIG. 2 is a schematic cross-sectional view illustrating another example of the production apparatus of a semiconductor layer according to the present invention.

FIG. 2 is a schematic cross-sectional view illustrating another example of an apparatus for practicing the present invention, in which DC power is applied together with high-frequency power to a VHF discharge electrode to overlap each other. In FIG. 2, reference numerals 201 to 212 correspond to the parts 101 to 112 in FIG. 1, respectively, and so their descriptions are omitted.

<Method of Applying High-frequency Bias Power>

As a method of applying the high-frequency bias power to the film forming chamber in the process of the present invention, there is preferably used a method in which a bias electrode for applying bias power is provided separately from a VHF discharge electrode within the film forming chamber. In this case, a direct current component of an electric current flowing into the bias electrode is measured as a direct current flowing into a choke coil by grounding the bias electrode through the choke coil.

Figure 3:
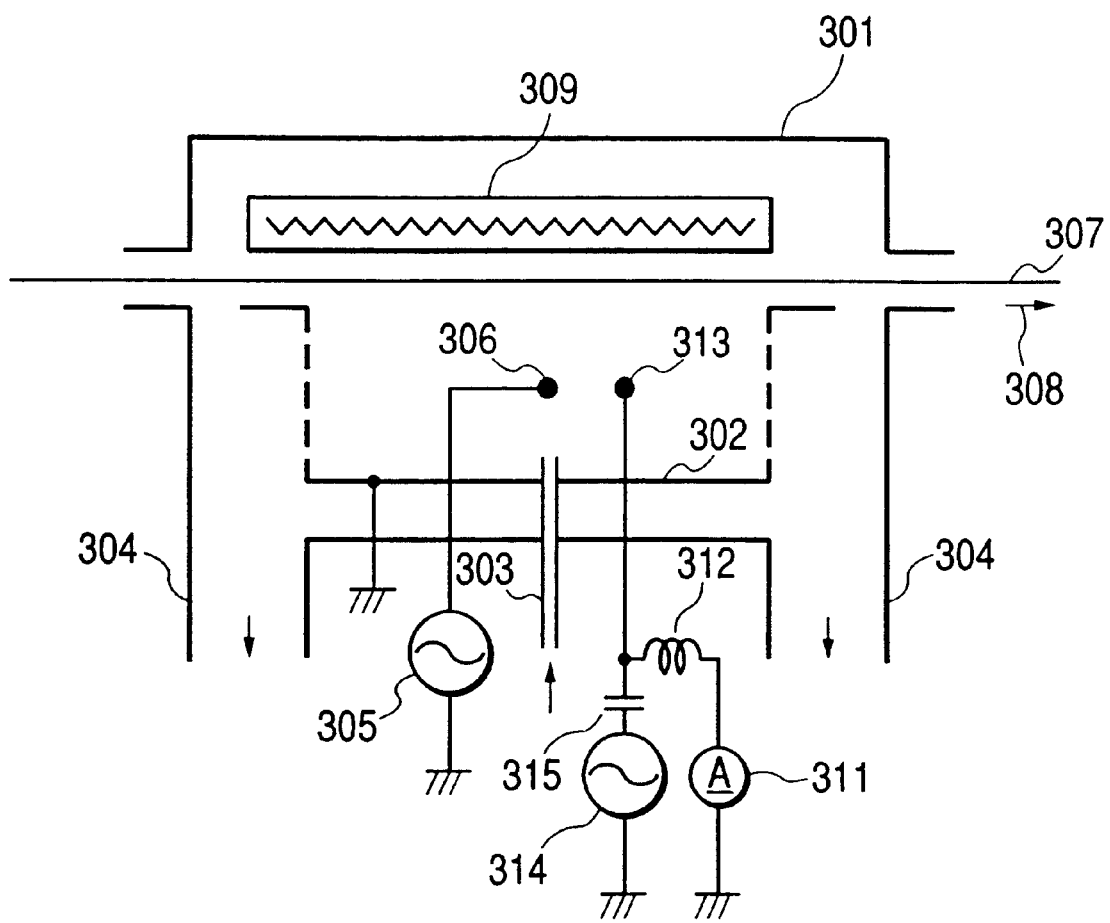
FIG. 3 is a schematic cross-sectional view illustrating a further example of the production apparatus of a semiconductor layer according to the present invention.

FIG. 3 is a schematic cross-sectional view illustrating a further example of an apparatus for practicing the present invention, in which a bias electrode for applying high-frequency bias power is provided separately from a VHF discharge electrode within a film forming chamber. In FIG. 3, reference numerals 301 to 309 and 311 to 313 correspond to the parts 101 to 109 and 111 to 113 in FIG. 1, respectively, and so their descriptions are omitted. Reference numerals 314 and 315 indicate a high-frequency power source of RF and a blocking capacitor, respectively.

In this case, a DC power source may be connected between a choke coil and a ground part to supply DC power at the same time, or the DC power may be supplied to the VHF discharge electrode at the same time. However, when the bias power is supplied to both VHF discharge electrode and bias electrode, a direct current component of an electric current flowing into the bias electrode amounts to a total of direct current components of electric currents flowing the respective electrodes to which the bias power is supplied.

<VHF (Very High Frequency)>

The VHF used in the plasma CVD process in the present invention means a frequency range higher than RF (radio frequency) such as 13.56 MHz, which has heretofore been in common use, but lower than microwave frequency such as 2.45 GHz, specifically, a frequency range of from 30 MHz to 500 MHz. Within this range, a relatively high frequency region is chosen for use in the case where it is intended to enhance a plasma density to increase a deposition rate, while a relatively low frequency region is chosen for use in the case where it is intended to use longer wavelength to form a uniform deposited film over a large area.

<Raw Gas>

A raw gas which becomes a raw material when a silicon type non-monocrystalline semiconductor film is produced in accordance with the process of the present invention is a gas comprising a compound which contains at least silicon atom and may be gasified. Such a gas may comprise a germanium atom-containing compound capable of being gasified, a carbon atom-containing compound capable of being gasified, or a mixed gas thereof.

Specifically, as the silicon atom-containing compound capable of being gasified, may be used a linear or cyclic silane compound. Specific examples thereof include gaseous or easily gasified compounds such as $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$, $SiHCl_3$, $SiH_2Br_2$, $SiH_2Cl_2$ and $Si_2Cl_3F_3$. In the above-mentioned compounds, D means heavy hydrogen.

When an amorphous silicon germanium film is formed as a deposited film, examples of a germanium atom-containing compound capable of being gasified, which is used as a raw gas, include $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$ and $Ge_2D_6$.

When an amorphous silicon carbide film is formed as a deposited film, examples of a carbon atom-containing compound capable of being gasified, which is used as a raw gas, include $CH_4$, $CD_4$, $C_nH_{2n+2}$ (n is an integer), $C_nH_{2n}$ (n is an integer), $C_2H_2$, $C_6H_6$, $CO_2$ and $CO$.

Examples of a substance introduced into a p-type layer or n-type layer for conducting valence electron control include atoms belonging to Group III and Group V of the periodic table.

Examples of a compound for introducing boron atom, which is preferably used as a starting substance for introducing an atom of Group III, include boron hydrides such as $B_2H_6$ and boron fluorides such as $BF_3$.

Examples of a compound for introducing phosphorus atom, which is preferably used as a starting substance for introducing an atom of Group V, include phosphorus hydrides such as $PH_3$ and phosphorus fluorides such as $PF_3$. Besides, $AsH_3$ or the like may be preferably used as a starting substance for introducing an atom of Group V.

The compound capable of being gasified may also be suitably diluted with a gas such as $H_2$, He, Ne, Ar, Xe or Kr before it is introduced into the film forming chamber.

A process and an apparatus in the case where the present invention is applied to the continuous formation of a plurality of semiconductor layers will now be described.

Figure 6:
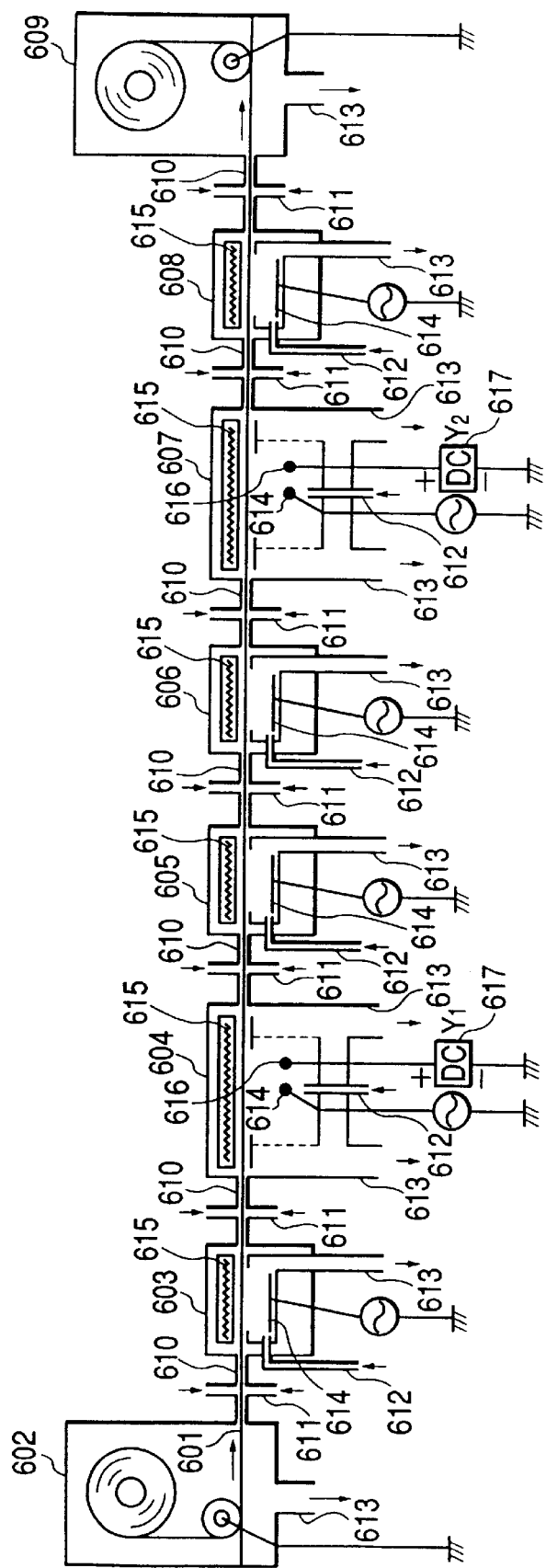
FIG. 6 is a schematic cross-sectional view illustrating an exemplary production apparatus of a roll to roll system according to an embodiment of the present invention.

FIG. 6 is a schematic cross-sectional view illustrating an exemplary production apparatus of a laminated semiconductor film according to the present invention.

In the apparatus illustrated in FIG. 6, a band-like substrate is continuously fed to pass through 6 plasma discharge chambers, thereby continuously producing a laminated silicon type non-monocrystalline semiconductor film of 6 layers used in, for example, a 2-layer tandem type solar cell.

In FIG. 6, continuous band-like substrate 601 rolled in the form of a coil in unrolling chamber 602 is unrolled, successively passes through plasma discharge chambers 603, 604, 605, 606, 607 and 608 and is then wound up in the form of a coil in winding chamber 609 equipped with a winding mechanism (not illustrated). Unrolling chamber 602, respective plasma discharge chambers 603 to 608 and winding chamber 609 are respectively connected to their adjoining chambers by gas gate 610.

Each gas gate 610 through which band-like substrate 601 passes is provided with gate gas inlet pipe 611 in the vicinity of the center part in its substrate feeding direction. A gas such as $H_2$ and He is introduced from this, thereby creating a flow of gas from the center of the gas gate toward each adjoining chamber to prevent the mixing of gases between adjacent chambers and separate raw gases from each other.

Respective plasma discharge chambers 603 to 608 are each provided with raw gas inlet pipe 612, exhaust pipe 613, discharge electrode 614 and heater 615 for heating the substrate, whereby semiconductor layers are laminated on a surface of the moving band-like substrate 601.

In the production apparatus of the present invention illustrated in FIG. 6, high-frequency discharge frequency in plasma discharge chambers 604 and 607 among plasma discharge chambers 603 to 608 is 105 MHz, and high-frequency discharge frequency in the other plasma discharge chambers 603, 605, 606 and 608 is 13.56 MHz.

In plasma discharge chambers 604 and 607 the discharge frequency of which is 105 MHz, high-frequency power is discharged from antenna electrode 614 provided within the discharge chamber. Bias electrode 616 is provided separately from the antenna electrode within each of plasma discharge chambers 604 and 607, and DC power is applied from DC power source 617 thereto.

In the production process and production apparatus according to the present invention, besides the substrate, an electrode is provided within each VHF plasma discharge chamber so as to apply DC bias voltage. Therefore, even when the electric potential of the substrate is common (for example, earth potential) within all the discharge chambers, DC bias voltage can be applied to plural VHF plasma discharge chambers at different voltage levels suitable for the respective discharge conditions thereof.

<Band-like Substrate>

A material of the band-like substrate suitably used in the production process and production apparatus according to the present invention is preferably such that it is scarcely deformed and distorted at a necessary temperature upon the formation of a semiconductor layer and has desired strength, and electrical conductivity.

Specific examples thereof include metal thin plates of metals such as stainless steel, aluminum and iron, and heat-resistant resins such as polyimide and Teflon, to the surfaces of which a conductivityimparting treatment has been made.

<Plasma Discharge Chamber>

In the production process and production apparatus according to the present invention, so far as the plasma CVD process by high frequency of VHF is conducted in at least two discharge chambers, discharge frequency in the other plasma discharge chambers may be either RF or microwave frequency.

Incidentally, in the present specification, only the case where high-frequency power of VHF is discharged from the rod electrode is described. However, the present invention is not limited thereto and is useful even in the case where a flat plate electrode is used. However, the use of the rod electrode is preferred from the viewpoint of matching impedance as described above.

The present invention will hereinafter be described in detail by the following Examples. However, the present invention is not limited in any way to these examples.

EXAMPLE 1

Figure 5:
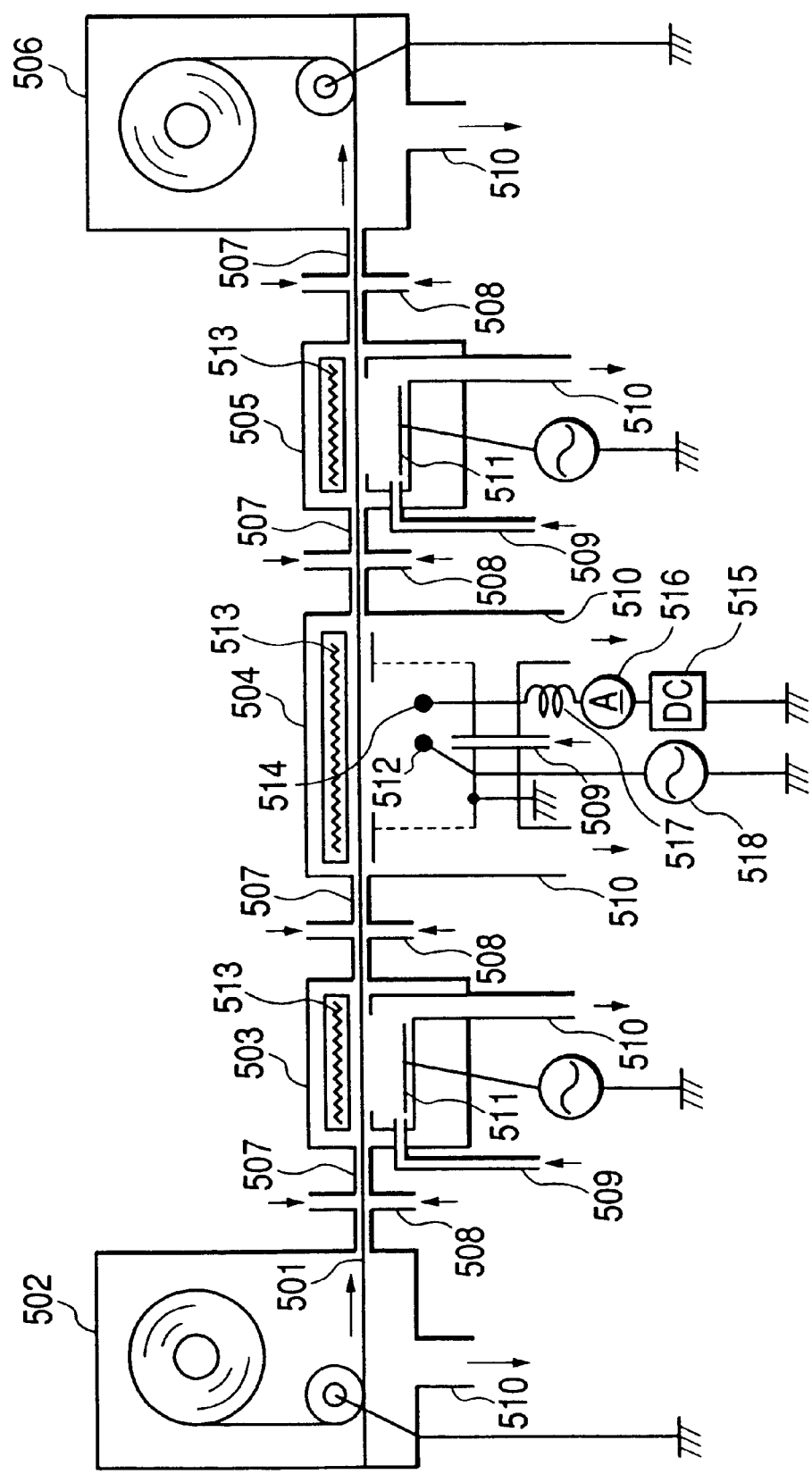
FIG. 5 is a schematic cross-sectional view illustrating a production apparatus used in Examples of the present invention.

An apparatus illustrated in FIG. 5 was used to fabricate a solar cell having a semiconductor layer of an nip structure comprising 3 silicon type non-monocrystalline films. In FIG. 5, chamber 504 for forming an i-type layer is the same as that illustrated in FIG. 1.

In the apparatus illustrated in FIG. 5, a band-like substrate is continuously moved to pass through 3 chambers, thereby continuously producing a laminated silicon type non-monocrystalline semiconductor film of 3 layers used in, for example, a solar cell.

In FIG. 5, continuous band-like substrate 501 rolled in the form of a coil in unrolling chamber 502 is unrolled, successively passes through chambers (film forming chambers) 503, 504 and 505 and is then wound up in the form of a coil in winding chamber 506 equipped with a winding mechanism (not illustrated). Unrolling chamber 502, respective chambers 503 to 505 and winding chamber 506 are respectively connected to their adjoining chambers by gas gate 507.

Each gas gate 507 through which band-like substrate 501 passes is provided with gate gas inlet pipe 508 in the vicinity of the center part in its substrate feeding direction. A gas such as $H_2$ or He is introduced from this, thereby creating a flow of gas from the center of the gas gate toward each adjoining chamber to prevent the mixing of gases between adjacent chambers and separate raw gases from each other.

Respective chambers 503 to 505 are each provided with raw gas inlet pipe 509, exhaust pipe 510, flat plate discharge electrode 511 or rod discharge electrode 512, and heater 513 for heating the substrate, whereby semiconductor layers are laminated on a surface of the moving band-like substrate 501.

In the apparatus illustrated in FIG. 5, high-frequency discharge frequency in chamber 504 among chambers 503 to 505 is 100 MHz, and high-frequency discharge frequency in the other chambers 503 and 505 is 13.56 MHz of RF.

In chamber 504, high-frequency power is discharged from rod discharge electrode 512 provided within the film forming chamber. VHF power source 518 is connected to rod discharge electrode 512.

In chamber 504, bias power is discharged from bias electrode 514 provided within the film forming chamber. DC power source 515 is connected to bias electrode 514, to which DC ammeter 516 and choke coil 517 are connected in series.

In the apparatus illustrated in FIG. 5, stainless steel substrate 501 (SUS 430-BA) having a length of 500 m, a width of 356 mm and a thickness of 0.15 mm was first set in unrolling chamber 502 in such a manner that it is unrolled from a bobbin wound in the form of a coil, passes through chambers 503, 504 and 505 via respective gas gates 507 and is then wound up in the form of a coil on a bobbin in winding chamber 506. The substrate was tensed by means of a tension applying mechanism (not illustrated).

Respective chambers 502 to 506 were then evacuated to 1 Pa or lower by exhausting means provided at the respective chambers.

While continuously evacuating the chambers, He gas (100 sccm) was introduced into each chamber from raw gas inlet pipe 509 in the chamber connected to a gas feeding means (not illustrated) to keep the internal pressure of the vacuum vessel at 100 Pa by controlling the opening of an exhaust valve (not illustrated) of exhaust pipe 510. In this state, the band-like substrate was controlled by a substrate feeding mechanism (not illustrated) connected to the bobbin in winding chamber 506 so as to continuously move at a moving rate of 1,200 mm/min.

Band-like substrate 501 was then heated under control by heater 513 for heating the substrate provided in each of film forming chambers 503 to 505, and a substrate temperature monitor (not illustrated) in such a manner that band-like substrate 501 moving through each chamber was heated to a prescribed temperature. When substrate 501 was uniformly heated within the respective chambers, the introduction of He gas was stopped while the substrate was continuously heated, and the gas fed to raw gas inlet pipe 509 was changed to a raw gas containing $SiH_4$.

Into each gas gate 507, $H_2$ (1,000 sccm) was introduced as a gas for separating raw gases from each other from gate gas inlet pipe 508 connected to a gas feeding means (not illustrated).

High-frequency power was then supplied to flat plate discharge electrode 511 or rod discharge electrode 512 in each chamber from a high-frequency power source to generate high-frequency discharge within each chamber, thereby decomposing the raw gas by plasma to deposit a laminated film of silicon type non-monocrystalline films on the continuously moving band-like substrate 501 and thus form a semiconductor layer for a solar cell comprising a silicon type non-monocrystalline semiconductor.

At that time, DC voltage (100 V) was applied to bias electrode 514 in chamber 504 in a positive direction to band-like substrate 501 of earth potential. At this time, a direct current component of an electric current flowing into bias electrode 514 was measured by DC ammeter 516 and found to be 3.0 A. The area of an inner wall of film forming chamber 504 was about 0.8 $m^2$, and so a bias current density was 3.0/0.8 $A/m^2$, i.e. 3.75 $A/m^2$. Film-forming conditions in the respective discharge chambers are shown in Table 1.

TABLE 1

|  | Film forming chamber 503 | Film forming chamber 504 | Film forming chamber 505 |
| --- | --- | --- | --- |
| Discharge frequency | 13.56 MHz | 100 MHz | 13.56 MHz |
| Deposited film | a-Si (n type) | a-Si (i type) | Microcrystalline Si (p type) |
| Deposited film thickness | 20 nm | 120 nm | 10 nm |
| High-frequency power | 200 W | 1500 W | 1500 W |
| Bias voltage |  | 100 V |  |
| Bias direct current |  | 3.0 A |  |
| Bias current density |  | 3.75 A/m$^2$ |  |
| Flow rate of raw gas | SiH$_4$: 200 sccm<br>H$_2$: 800 sccm<br>PH$_3$: 18 sccm | SiH$_4$: 400 sccm<br>H$_2$: 1200 sccm | SiH$_4$: 20 sccm<br>H$_2$: 2000 sccm<br>BF$_3$: 1 sccm |
| Substrate temperature | 300° C. | 330° C. | 200° C. |
| Pressure | 133 Pa | 3 Pa | 133 Pa |

After such deposition of films was continuously conducted on the band-like substrate over 400 m, the supply of the discharge power and the introduction of the raw gases into the respective chambers, and the heating of the band-like substrate were stopped, the chambers were sufficiently purged to fully cool the band-like substrate and the interior of the apparatus, and the apparatus was then opened to the air to take out the band-like substrate wound up on the bobbin in the winding chamber, on which the laminated semiconductor films had been formed.

The band-like substrate thus taken out was continuously processed by a continuous modulization apparatus to form a thin ITO film 60 nm thick as a transparent electrode on the entire surface of each of the laminated semiconductor films formed by the apparatus according to the present invention, and fine Ag electrodes as collecting electrodes were then formed at regular intervals thereon. The thus-processed substrate was cut into modules, thereby fabricating solar cell modules of an nip structure in a rectangular form 35 cm in width and 5 cm in length in the moving direction of the substrate.

The thus-fabricated solar cell modules were evaluated as to characteristics under exposure to artificial sunlight of AM 1.5 (100 mW/cm$^2$).

As the result of the evaluation of characteristics, it was found that the average photoelectric conversion efficiency of the fabricated solar cell modules was increased to 1.3 times compared with solar cell modules (Comparative Module) fabricated in the same manner except that no application of the DC bias voltage in chamber 504 was conducted (the bias electrode was removed), the average photoelectric conversion efficiency of which was regarded as 1.0. In addition, the proportion defective by short-circuit was as low as about 2% and was not different from the case where no bias power was applied.

Comparative Example 1–1

A solar cell having a semiconductor layer of an nip structure comprising 3 silicon type non-monocrystalline films was fabricated on a stainless steel substrate in the same manner as in Example 1 except that the DC voltage in film forming chamber 504 was changed to 10 V. A direct current flowing into the bias electrode was 0.04 A, and a bias current density was 0.05 A/m$^2$.

Solar cell modules were continuously fabricated in the same manner as in Example 1 to evaluate them as to characteristics. As a result, it was found that the photoelectric conversion efficiency thereof was not improved as demonstrated by 1.0 time compared with Comparative Module.

Comparative Example 1–2

A solar cell having a semiconductor layer of an nip structure comprising 3 silicon type non-monocrystalline films was fabricated on a stainless steel substrate in the same manner as in Example 1 except that the DC voltage in film forming chamber 504 was changed to 500 V. A direct current flowing into the bias electrode was 12 A, and a bias current density was 15 A/m$^2$.

Solar cell modules were continuously fabricated in the same manner as in Example 1 to evaluate them as to characteristics. As a result, it was found that in modules free of any defect by short-circuit, the photoelectric conversion efficiency thereof was increased to 1.3 times compared with Comparative Module. However, minute spark marks were partially observed in the modules, and the proportion defective by short-circuit was as extremely high as about 60%.

EXAMPLE 2

A solar cell having a semiconductor layer of an nip structure comprising 3 silicon type non-monocrystalline films was fabricated on a stainless steel substrate in the same manner as in Example 1 except that the method of applying the DC power in film forming chamber 504 was changed to the simultaneous application from the VHF discharge electrode as illustrated in FIG. 2.

Incidentally, a direct current flowing into the electrode was 3.2 A, and a bias current density was 3.2/0.8 A/m$^2$, i.e. 4.0 A/m$^2$.

Solar cell modules were continuously fabricated in the same manner as in Example 1 to evaluate them as to characteristics. As a result, it was found that the photoelectric conversion efficiency thereof was increased to 1.3 times compared with Comparative Module.

In addition, the proportion defective by short-circuit was as low as about 2% and was not different from the case where no bias power was applied.

EXAMPLE 3

A solar cell having a semiconductor layer of an nip structure comprising 3 silicon type non-monocrystalline films was fabricated on a stainless steel substrate in the same manner as in Example 1 except that the bias power in film forming chamber 504 was changed to high-frequency power of RF, and the method of applying the bias power was changed as illustrated in FIG. 3. Film-forming conditions in the respective discharge chambers are shown in Table 2.

Incidentally, a direct current flowing into the bias electrode was 2.4 A, and a bias current density was 2.4/0.8 A/m$^2$, i.e. 3.0 A/m$^2$.

TABLE 2

|  | Film forming chamber 503 | Film forming chamber 504 | Film forming chamber 505 |
| --- | --- | --- | --- |
| Discharge frequency | 13.56 MHz | 100 MHz | 13.56 MHz |
| Deposited film | a-Si (n type) | a-Si (i type) | Microcrystalline Si (p type) |
| Deposited film thickness | 20 nm | 120 nm | 10 nm |
| High-frequency power | 200 W | 1500 W | 1500 W |
| Bias power |  | 1500 W (13.56 MHz) |  |
| Bias direct current |  | 2.4 A |  |
| Bias current density |  | 3.0 A/m$^2$ |  |
| Flow rate of raw gas | SiH$_4$: 200 sccm<br>H$_2$: 800 sccm<br>PH$_3$: 18 sccm | SiH$_4$: 400 sccm<br>H$_2$: 1200 sccm | SiH$_4$: 20 sccm<br>H$_2$: 2000 sccm<br>BF$_3$: 1 sccm |
| Substrate temperature | 300° C. | 330° C. | 200° C. |
| Pressure | 133 Pa | 3 Pa | 133 Pa |

Solar cell modules were continuously fabricated in the same manner as in Example 1 to evaluate them as to characteristics. As a result, it was found that the photoelectric conversion efficiency thereof was increased to 1.25 times compared with Comparative Module.

In addition, the proportion defective by short-circuit was as low as about 1.5% and was not different from the case where no bias power was applied.

EXAMPLE 4

A solar cell having a semiconductor layer of an nip structure comprising 3 silicon type non-monocrystalline films was fabricated on a stainless steel substrate in the same manner as in Example 1 except that the film deposited in film forming chamber 504 was changed to amorphous silicon germanium, and the DC voltage applied was changed to 200 V. Film-forming conditions in the respective discharge chambers are shown in Table 3.

Incidentally, a direct current flowing into the bias electrode was 2.8 A, and a bias current density was 2.8/0.8 A/m$^2$, i.e. 3.5 A/m$^2$.

EXAMPLE 5

A solar cell having a semiconductor layer of an nip structure comprising 3 silicon type non-monocrystalline films was fabricated on a stainless steel substrate in the same manner as in Example 4 except that the discharge frequency in film forming chamber 504 was changed to 500 MHz.

Incidentally, a direct current flowing into the bias electrode was 2.8 A, and a bias current density was 2.8/0.8 A/m$^2$, i.e. 3.5 A/m$^2$.

Solar cell modules were continuously fabricated in the same manner as in Example 1 to evaluate them as to characteristics. As a result, it was found that the photoelectric conversion efficiency thereof was increased to 1.30 times compared with Comparative Module.

In addition, the proportion defective by short-circuit was as low as about 2.5% and was not different from the case where no bias power was applied.

EXAMPLE 6

In Example 6, a production apparatus of a laminated semiconductor film according to the present invention,

TABLE 3

|  | Film forming chamber 503 | Film forming chamber 504 | Film forming chamber 505 |
| --- | --- | --- | --- |
| Discharge frequency | 13.56 MHz | 100 MHz | 13.56 MHz |
| Deposited film | a-Si (n type) | a-SiGe (i type) | Microcrystalline Si (p type) |
| Deposited film thickness | 20 nm | 120 nm | 10 nm |
| High-frequency power | 200 W | 1500 W | 1500 W |
| Bias voltage |  | 200 V |  |
| Bias direct current |  | 2.8 A |  |
| Bias current density |  | 3.5 A/m$^2$ |  |
| Flow rate of raw gas | SiH$_4$: 200 sccm<br>H$_2$: 800 sccm<br>PH$_3$: 18 sccm | SiH$_4$: 200 sccm<br>GeH$_4$: 200 sccm<br>H$_2$: 1200 sccm | SiH$_4$: 20 sccm<br>H$_2$: 2000 sccm<br>BF$_3$: 1 sccm |
| Substrate temperature | 300° C. | 330° C. | 200° C. |
| Pressure | 133 Pa | 3 Pa | 133 Pa |

Solar cell modules were continuously fabricated in the same manner as in Example 1 to evaluate them as to characteristics. As a result, it was found that the photoelectric conversion efficiency thereof was increased to 1.35 times compared with Comparative Module.

In addition, the proportion defective by short-circuit was as low as about 2.0% and was not different from the case where no bias power was applied.

which has the construction illustrated in FIG. 6, was used to fabricate a solar cell having a semiconductor layer of an nipnip structure comprising 6 silicon type non-monocrystalline films.

In the apparatus illustrated in FIG. 6, stainless steel substrate 601 (SUS 430-BA) having a length of 500 m, a width of 356 mm and a thickness of 0.15 mm was first set in unrolling chamber 602 in such a manner that it is unrolled from a bobbin wound in the form of a coil, passes through glow discharge chambers 603, 604, 605, 606, 607 and 608 via respective gas gates 610 and is then wound up in the form of a coil on a bobbin in winding chamber 609. The substrate was tensed by means of a tension applying mechanism (not illustrated).

The respective vacuum chambers 602 to 609 were then evacuated to 1 Pa or lower by exhausting means provided at the respective chambers.

While continuously evacuating the chambers, He gas (100 sccm) was introduced into each plasma discharge chamber from raw gas inlet pipe 612 in the plasma discharge chamber connected to a gas feeding means (not illustrated) to keep the internal pressure of the chamber (vacuum vessel) at 100 Pa by controlling the opening of an exhaust valve (not illustrated) of exhaust pipe 613.

In this state, the band-like substrate was controlled by a substrate feeding mechanism (not illustrated) connected to the bobbin in winding chamber 609 so as to continuously move at a moving rate of 600 mm/min.

Band-like substrate 601 was then heated under control by heater 615 for heating the substrate provided in each of plasma discharge chambers 603 to 608, and a substrate temperature monitor (not illustrated) in such a manner that band-like substrate 601 moving through each plasma discharge chamber was heated to a prescribed temperature.

When substrate 601 was uniformly heated within the respective glow discharge chambers, the introduction of He gas was stopped while the substrate was continuously heated. The gas fed to raw gas inlet pipe 612 was changed to a raw gas containing $SiH_4$.

Into each gas gate 610, $H_2$ (1,000 sccm) was introduced as a gas for separating raw gases from each other from gate gas inlet pipe 611 connected to a gas feeding means (not illustrated).

High-frequency power was then supplied to discharge electrode 614 in each plasma discharge chamber from a high-frequency power source to generate glow discharge within each glow discharge chamber, thereby decomposing the raw gas by plasma to deposit a laminated film of silicon type non-monocrystalline films on the continuously moving band-like substrate 601 and thus form a semiconductor layer for a solar cell of a 2-layer tandem structure having a silicon type non-monocrystalline semiconductor.

Incidentally, discharge frequency in plasma discharge chambers 604 and 607 was 105 MHz, and their discharge electrodes were in the form of a rod, while discharge frequency in plasma discharge chambers 603, 605, 606 and 608 was 13.56 MHz, and their discharge electrodes were in the form of a flat plate.

At that time, DC voltage (300 V) was applied to the bias electrode in plasma discharge chamber 604 in a positive direction to the band-like substrate of earth potential, and DC voltage (100 V) was applied to the bias electrode in plasma discharge chamber 607 in a positive direction to the band-like substrate of earth potential. At this time, a direct current component of an electric current flowing into the bias electrode in plasma discharge chamber 604 was 7.5 A. The area of an inner wall of the film forming chamber was about 0.8 $m^2$, and so a bias current density was 9.38 $A/m^2$. A direct current component of an electric current flowing into the bias electrode in plasma discharge chamber 607 was 3.0 A. The area of an inner wall of the film forming chamber 607 was about 0.8 $m^2$, and so a bias current density was 3.75 $A/m^2$.

Film-forming conditions in the respective plasma discharge chambers are shown in Table 4.

TABLE 4

|  | Film forming chamber 603 | Film forming chamber 604 | Film forming chamber 605 |
| --- | --- | --- | --- |
| Deposited film | a-Si (n type) | a-SiGe (i type) | Microcrystalline Si (p type) |
| Deposited film thickness | 20 nm | 100 nm | 10 nm |
| Bias voltage |  | 300 V |  |
| Bias direct current |  | 7.5 A |  |
| Bias current density |  | 9.38 $A/m^2$ |  |
| Discharge frequency | 13.56 MHz | 105 MHz | 13.56 MHz |
| Discharge power | 200 W | 1500 W | 1500 W |
| Flow rate of raw gas | $SiH_4$: 200 sccm | $SiH_4$: 200 sccm | $SiH_4$: 20 sccm |
|  | $H_2$: 800 sccm | $GeH_4$: 200 sccm | $H_2$: 2000 sccm |
|  | $PH_3$: 18 sccm | $H_2$: 1200 sccm | $BF_3$: 1 sccm |
| Substrate temperature | 300° C. | 330° C. | 200° C. |
| Pressure | 133 Pa | 3 Pa | 133 Pa |
| Average deposition rate | 0.4 nm/sec | 4 nm/sec | 0.1 nm/sec |
|  | Film forming chamber 606 | Film forming chamber 607 | Film forming chamber 608 |
| Deposited film | a-Si (n type) | a-Si (i type) | Microcrystalline Si (p type) |
| Deposited film thickness | 20 nm | 100 nm | 10 nm |
| Bias voltage |  | 100 V |  |
| Bias direct current |  | 3.0 A |  |
| Bias current density |  | 3.75 $A/m^2$ |  |
| Discharge frequency | 13.56 MHz | 105 MHz | 13.56 MHz |
| Discharge power | 200 W | 1500 W | 1500 W |
| Flow rate of raw gas | $SiH_4$: 200 sccm | $SiH_4$: 400 sccm | $SiH_4$: 20 sccm |
|  | $H_2$: 800 sccm | $H_2$: 1200 sccm | $H_2$: 2000 sccm |
|  | $PH_3$: 18 sccm |  | $PH_3$: 1 sccm |
| Substrate temperature | 300° C. | 220° C. | 200° C. |
| Pressure | 133 Pa | 3 Pa | 133 Pa |
| Average deposition rate | 0.4 nm/sec | 4 nm/sec | 0.1 nm/sec |

After such deposition of films was continuously conducted on the band-like substrate over 400 m, the supply of the discharge power and the introduction of the raw gases into the respective plasma discharge chambers, and the heating of the band-like substrate were stopped, the chambers were sufficiently purged to fully cool the band-like substrate and the interior of the apparatus, and the apparatus was then opened to the air to take out the band-like substrate wound up on the bobbin in the winding chamber, on which the laminated semiconductor films had been formed.

The band-like substrate thus taken out was continuously processed by a continuous modulization apparatus to form a thin ITO film 60 nm thick as a transparent electrode on the entire surface of each of the laminated semiconductor films formed by the apparatus according to the present invention, and fine Ag electrodes as collecting electrodes were then formed at regular intervals thereon. The thus-processed substrate was cut into modules, thereby continuously fabricating 2-layer tandem type solar cell modules 35-cm square having a semiconductor layer of an nipnip structure.

The thus-fabricated solar cell modules were evaluated as to characteristics under exposure to artificial sunlight of AM 1.5 (100 mW/cm$^2$).

As the result of the evaluation of characteristics, it was found that the average photoelectric conversion efficiency of the fabricated solar cell modules was increased to 1.4 times compared with solar cell modules fabricated in the same manner except that no bias voltage was applied to discharge chambers 604 and 607, the average photoelectric conversion efficiency of which was regarded as 1, to 1.2 times compared with the case where 100 V of bias voltage was applied to both discharge chambers 604 and 607, and to 1.2 times compared with the case where 300 V of bias voltage was applied to both discharge chambers 604 and 607. It was thus confirmed that the photoelectric conversion efficiency of the solar cell modules fabricated by applying bias voltage at different levels to 2 discharge chambers is more improved.

EXAMPLE 7

Two-layer tandem type solar cell modules 35-cm square having a semiconductor layer of an nipnip structure were continuously fabricated in the same manner as in Example 6 except that the method of applying the bias voltage in the VHF discharge chambers was changed to a method in which DC voltage is applied to each high-frequency discharge electrode to overlap high-frequency power.

Figure 7:
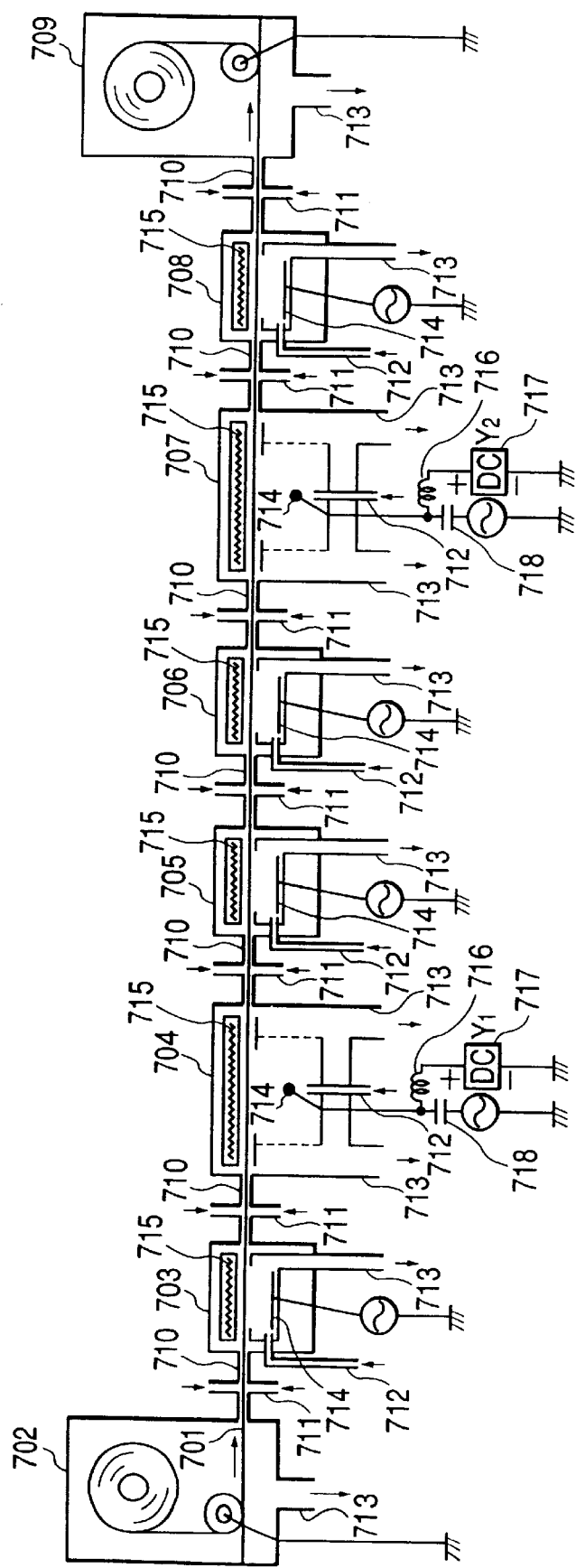
FIG. 7 is a schematic cross-sectional view illustrating another exemplary production apparatus of a roll to roll system according to the embodiment of the present invention.

FIG. 7 is a schematic cross-sectional view illustrating a production apparatus of a laminated semiconductor film according to the present invention used in this example.

In FIG. 7, reference numerals 701 to 717 correspond to the parts 601 to 617 in FIG. 6, respectively, and so their descriptions are omitted.

The apparatus illustrated in FIG. 7 is so constructed that no bias electrode 616 is provided in VHF discharge chambers 704 and 707, and DC voltage is applied to high-frequency discharge electrode 714 via choke coil 716. Direct current components of electric currents flowing into the electrodes in discharge chamber 704 and 707 were 8.0 A and 3.2 A, respectively, and so bias current densities were 10 A/m$^2$ and 4.0 A/m$^2$, respectively.

Each VHF power source is connected to high-frequency discharge electrode 714 through capacitor 718.

In FIG. 7, the meanings of reference numerals of 700s given to portions depicted similarly to FIG. 6 are the same as those of their corresponding 600s in FIG. 6.

The thus-fabricated solar cell modules were evaluated as to characteristics under exposure to artificial sunlight of AM 1.5 (100 mW/cm$^2$).

As the result of the evaluation of characteristics, it was found that the average photoelectric conversion efficiency of the fabricated solar cell modules was increased to 1.4 times compared with solar cell modules fabricated in the same manner except that no bias voltage was applied to discharge chambers 704 and 707, the average photoelectric conversion efficiency of which was regarded as 1, to 1.2 times compared with the case where 100 V of bias voltage was applied to both discharge chambers 704 and 707, and to 1.2 times compared with the case where 300 V of bias voltage was applied to both discharge chambers 704 and 707. Even in this bias voltage applying method, it was thus confirmed that the photoelectric conversion efficiency of the solar cell modules fabricated by applying bias voltage at different levels to 2 discharge chambers is more improved.

EXAMPLE 8

Two-layer tandem type solar cell modules 35-cm square having a semiconductor layer of an nipnip structure were continuously fabricated in the same manner as in Example 6 except that the discharge frequency in discharge chambers 604 and 607 was changed to 30 MHz.

The thus-fabricated solar cell modules were evaluated as to characteristics under exposure to artificial sunlight of AM 1.5 (100 mW/cm$^2$).

As the result of the evaluation of characteristics, it was found that the average photoelectric conversion efficiency of the fabricated solar cell modules was increased to 1.3 times compared with solar cell modules fabricated in the same manner except that no bias voltage was applied to discharge chambers 604 and 607, the average photoelectric conversion efficiency of which was regarded as 1, to 1.15 times compared with the case where 100 V of bias voltage was applied to both discharge chambers 604 and 607, and to 1.15 times compared with the case where 300 V of bias voltage was applied to both discharge chambers 604 and 607. Even in this bias voltage applying method, it was thus confirmed that the photoelectric conversion efficiency of the solar cell modules fabricated by applying bias voltage at different levels to 2 discharge chambers is more improved.

EXAMPLE 9

Two-layer tandem type solar cell modules 35-cm square having a semiconductor layer of an nipnip structure were continuously fabricated in the same manner as in Example 6 except that the discharge frequency in discharge chambers 604 and 607 was changed to 450 MHz.

The thus-fabricated solar cell modules were evaluated as to characteristics under exposure to artificial sunlight of AM 1.5 (100 mW/cm$^2$).

As the result of the evaluation of characteristics, it was found that the average photoelectric conversion efficiency of the fabricated solar cell modules was increased to 1.5 times compared with solar cell modules fabricated in the same manner except that no bias voltage was applied to discharge chambers 604 and 607, the average photoelectric conversion efficiency of which was regarded as 1, to 1.3 times compared with the case where 100 V of bias voltage was applied to both discharge chambers 604 and 607, and to 1.3 times compared with the case where 300 V of bias voltage was applied to both discharge chambers 604 and 607. Even in this bias voltage applying method, it was thus confirmed that the photoelectric conversion efficiency of the solar cell modules fabricated by applying bias voltage at different levels to 2 discharge chambers is more improved.

As described above, the present invention can solve the problem involved in the case where in the process for forming a silicon type non-monocrystalline semiconductor by the plasma CVD process, the VHF plasma CVD process capable of achieving a high film-forming rate is applied to the deposition of a large-area film, that is to say, the problem that although it is necessary to apply a moderate DC electric field together with a high-frequency electric field, it is difficult to control the quantity of bias supply power for achieving a good bias effect while preventing the occurrence of a failure by spark or charge-up in the resulting deposited film, so as to easily set a proper quantity of bias supply power, thereby depositing a good-quality silicon type non-monocrystalline semiconductor film over a large area at a high speed.

The process according to the present invention is effective when applied to the formation of an i-type layer in a photovoltaic cell.

The present invention also can overcome the problem that when the VHF plasma CVD process capable of obtaining high-density plasma is introduced into the production process and production apparatus of a laminated semiconductor layer according to the roll to roll system or the like which can continuously form a deposited film over a large area, bias voltage cannot be independently controlled by any conventional process if plural VHF discharge chambers exist, and hence has an excellent effect that the VHF plasma CVD process can be introduced, and DC electric fields can be controlled to respective proper levels, thereby producing a good-quality laminated semiconductor film.

What is claimed is:

1. A process for fabricating a photovoltaic cell, comprising the steps of introducing a raw gas into a discharge chamber and supplying high-frequency power to the chamber to decompose the raw gas by discharge, thereby forming an i-type semiconductor layer on a substrate within the discharge chamber, the process comprising the steps of:

supplying high-frequency power of at least very high frequency (VHF) as the high-frequency power in the step of forming the i-type semiconductor layer;

supplying bias power of direct current power and/or high-frequency power of radio-frequency (RF) together with the high-frequency power of VHF to the discharge chamber; and controlling a direct current component of an electric current flowing into an electrode, to which the bias power is supplied, so as to fall within a range of from 0.1 A/m$^2$ to 10 A/m$^2$ in terms of a current density based on the area of an inner wall of the discharge chamber.

2. The process according to claim 1, wherein the electric potential of the electrode, to which the bias power is supplied, is controlled to the same level as that of the substrate or positive potential against the substrate.

3. The process according to claim 2, wherein a potential difference between the electrode, to which the bias power is supplied, and the substrate is controlled within a range of from 0 to 500 V.

4. The process according to claim 1, wherein a raw gas comprising a silicon atom-containing molecule is used as the raw gas to form a silicon type non-monocrystalline semiconductor layer on the substrate.

5. The process according to claim 1, wherein the substrate and the inner wall surface of the discharge chamber are controlled to earth potential.

6. The process according to claim 1, wherein the bias power is supplied to an electrode provided independently of the electrode to which the high-frequency power of VHF is supplied.

7. The process according to claim 1, wherein the bias power is supplied to the electrode to which the high-frequency power of VHF is supplied.

8. The process according to claim 1, wherein direct current power is used as the bias power.

9. The process according to claim 1, wherein the i-type semiconductor layer is formed in accordance with a plasma CVD process.

10. The process according to claim 1, wherein a band-like substrate is used as the substrate.

11. The process according to claim 1, wherein a conductive substrate is used as the substrate.

12. The process according to claim 1, wherein the substrate is used as a part of the inner wall of the discharge chamber.

13. The process according to claim 1, which further comprises the step of forming an n-type semiconductor layer and the step of forming a p-type semiconductor layer, respectively, before and after the step of forming the i-type semiconductor layer.

14. A process for fabricating a photovoltaic cell by introducing a raw gas into a plurality of discharge chambers, supplying high-frequency power to the chambers to decompose the raw gas by discharge, and causing a substrate to successively pass through the discharge chambers, thereby at least forming a plurality of i-type semiconductor layers on the substrate, the process comprising the steps of:

supplying high-frequency power of very high frequency (VHF) as the high-frequency power to two or more discharge chambers of the plural discharge chambers in which the respective i-type semiconductor layers are formed;

supplying bias power of different levels from each other to the discharge chambers, to which the high-frequency power of VHF is supplied, according to respective film-forming conditions in the discharge chambers; and controlling the electric potential of each electrode, to which the bias power is supplied, to the same level as that of the substrate or positive potential against the substrate.

15. The process according to claim 14, wherein a direct current component of an electric current flowing into each electrode, to which the bias power is supplied, is controlled so as to fall within a range of from 0.1 A/m$^2$ to 10 A/m$^2$ in terms of a current density based on the area of an inner wall of the discharge chamber.

16. The process according to claim 14, wherein a potential difference between each electrode, to which the bias power is supplied, and the substrate is controlled within a range of from 0 to 500 V.

17. The process according to claim 14, wherein a raw gas comprising a silicon atom-containing molecule is used as the raw gas to form a silicon type non-monocrystalline semiconductor layer on the substrate.

18. The process according to claim 14, wherein the substrate and the inner wall surfaces of the discharge chambers are controlled to earth potential.

19. The process according to claim 14, wherein the bias power is supplied to an electrode provided independently of the electrode to which the high-frequency power of VHF is supplied.

20. The process according to claim 14, wherein the bias power is supplied to the electrode to which the high-frequency power of VHF is supplied.

21. The process according to claim 14, wherein direct current power is used as the bias power.

22. The process according to claim 14, wherein all the i-type semiconductor layers are formed in accordance with a plasma CVD process.

23. The process according to claim 14, wherein a band-like substrate is used as the substrate.

24. The process according to claim 14, wherein a conductive substrate is used as the substrate.

25. The process according to claim 14, wherein the substrate is used as a part of the inner wall of the discharge chamber.

26. The process according to claim 14, which further comprises the step of forming an n-type semiconductor layer and the step of forming a p-type semiconductor layer, respectively, before and after the respective steps of forming the plural i-type semiconductor layers.

* * * * *